United States Patent
Wang et al.

(10) Patent No.: US 8,927,406 B2
(45) Date of Patent: Jan. 6, 2015

(54) DUAL DAMASCENE METAL GATE

(71) Applicant: Taiwan Semiconductor Manufacturing Company, Ltd., Hsin-Chu (TW)

(72) Inventors: Chun-Chieh Wang, Kaohsiung (TW);
Wen-Chu Hsiao, Tainan (TW);
Ying-Min Chou, Tainan (TW);
Hsiang-Hsiang Ko, Sinying (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 30 days.

(21) Appl. No.: 13/738,823

(22) Filed: Jan. 10, 2013

(65) Prior Publication Data
US 2014/0191299 A1 Jul. 10, 2014

(51) Int. Cl.
*H01L 21/02* (2006.01)
*H01L 21/3205* (2006.01)
*H01L 21/336* (2006.01)
*H01L 29/76* (2006.01)
*H01L 29/40* (2006.01)

(52) U.S. Cl.
CPC ............ *H01L 29/401* (2013.01); *H01L 29/408* (2013.01)
USPC ........... 438/585; 438/301; 438/210; 438/382; 438/405; 438/586; 257/288; 257/19; 257/E21.335; 257/E21.409; 257/E21.663

(58) Field of Classification Search
CPC .................. H01L 21/76807; H01L 21/76808; H01L 21/76811; H01L 21/76813; H01L 21/28141; H01L 21/0337; H01L 21/823468; H01L 21/823874; H01L 21/2815; H01L 21/28132; H01L 21/3066; H01L 21/8234; H01L 21/823814; H01L 21/28105; H01L 21/26506; H01L 21/823807; H01L 21/823841; H01L 21/823878; H01L 2221/1015; H01L 2221/1021; H01L 2221/1031; H01L 2221/1036; H01L 2224/05006; H01L 2224/05546; H01L 45/1683; H01L 29/40
USPC ........ 438/585, 183, 184, 196, 197, 210, 230, 438/276, 281, 285, 289, 294, 296, 301, 303, 438/304, 305, 382, 405, 528, 586, 591, 595, 438/696, 938; 257/288, 19, 61, 190, 390, 257/347, 350, 374, 408, 623, 626, 704, 257/E21.038, E21.64, E21.196, E21.235, 257/E21.415, E21.431, E21.433, E21.335, 257/E21.444, E21.569, E21.618–E21.635, 257/E29.056
See application file for complete search history.

(56) References Cited

U.S. PATENT DOCUMENTS

| | | | |
|---|---|---|---|
| 6,310,367 B1 * | 10/2001 | Yagishita et al. | 257/190 |
| 2010/0176426 A1 * | 7/2010 | Meunier-Bellard et al. | 257/288 |
| 2010/0264494 A1 * | 10/2010 | Doyle et al. | 257/365 |
| 2012/0142150 A1 * | 6/2012 | Jiang et al. | 438/197 |
| 2013/0307079 A1 * | 11/2013 | Jagannathan et al. | 257/365 |
| 2014/0011333 A1 * | 1/2014 | McKee et al. | 438/210 |
| 2014/0042501 A1 * | 2/2014 | Chen et al. | 257/288 |

* cited by examiner

*Primary Examiner* — Wensing Kuo
*Assistant Examiner* — Moazzam Hossain
(74) *Attorney, Agent, or Firm* — Haynes and Boone, LLP

(57) ABSTRACT

A method for fabricating a dual damascene metal gate includes forming a dummy gate onto a substrate, disposing a protective layer on the substrate and the dummy gate, and growing an expanding layer on sides of the dummy gate. The method further includes removing the protective layer, forming a spacer around the dummy gate, and depositing and planarizing a dielectric layer. The method further includes selectively removing the expanding layer, and removing the dummy gate.

20 Claims, 5 Drawing Sheets

DUAL DAMASCENE METAL GATE

BACKGROUND

Transistors are a common component formed into integrated circuits. A transistor is typically formed by disposing a conductive material to form a gate over a semiconductor substrate, with an intervening layer of gate oxide. The portions of the semiconductor substrate on opposite sides of the gate are doped to form the source and drain regions of the transistor.

Transistor gates are typically made from a non-metallic conductive material such as polysilicon. This is because the interface between polysilicon and gate oxide can be beneficial. But, the conductivity of the poly-silicon layer is relatively low, which can cause a low charge accumulation. This, in turn, can lead to unwanted delays in circuits. Moreover, use of a polysilicon gate can cause a depletion region on the polysilicon-oxide interface which can have an adverse effect on the channel formation. Consequently, some circuit designers are looking into metal gates.

Metal gates, however, have issues that have to be overcome by designers. For example, the metal material is prone to damage from various lithographic processing steps. Specifically, a thermal annealing process performed on the semiconductor substrate can damage a metal gate. Thus, dummy gates are often formed in place of metal gates. After the procedures which have a potential to damage a metal gate have been performed, the dummy gate can be replaced with a metal gate. It is desirable to be able to remove and replace the dummy gates in a clean, precise, and cost-efficient manner.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIGS. 1A-1H are diagrams showing an illustrative process 100 for replacing a dummy gate with a dual damascene metal gate. The following discusses various processes involved in forming a dual damascene metal gate. The following is not intended to be a comprehensive discussion of every procedure used when forming a metal gate embodying principles described herein.

Figure 1A:
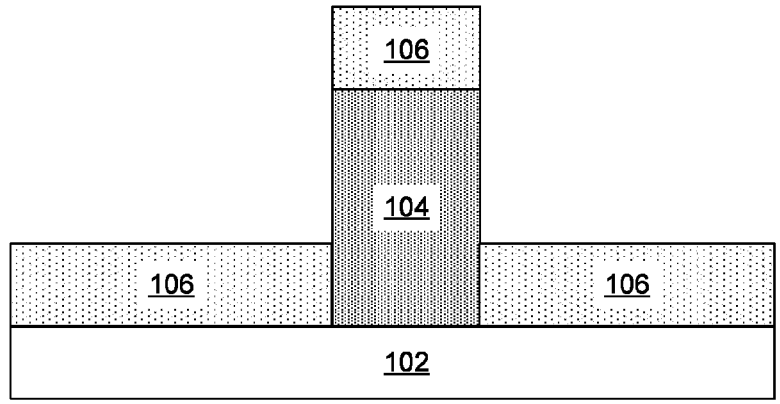
FIGS. 1A-1H are diagrams showing an illustrative process for replacing a dummy gate with a dual damascene metal gate, according to one example of principles described herein.

According to the present example, FIG. 1A illustrates a dummy gate 104 that is formed onto a substrate 102. The dummy gate 104 may be made of a crystalline material on which epitaxial processes may be performed. For example, the dummy gate may be made of polysilicon. The dummy gate 104 may be formed using standard lithographic techniques. The substrate 102 may be made of a standard semiconductor material such as silicon.

After the dummy gate 104 has been formed, a protective layer 106 is deposited onto both the substrate 102 and the top of the dummy gate. The protective layer 106 is not deposited on the sides of the dummy gate 104. The protective layer 106 may be made of a material such as Silicon Anti-Reflective Coating (SiARC). The protective layer 106 is made of a material that is not compatible with an epitaxial process. This allows for a selective epitaxial growth of material on the dummy gate 104.

Figure 1B:
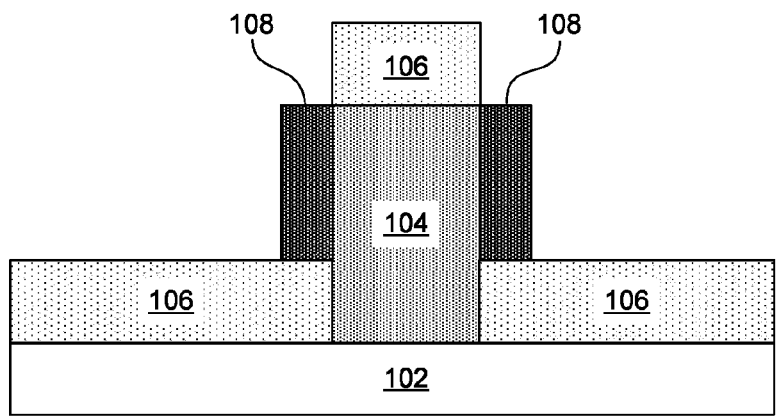

FIG. 1B illustrates an expanding layer 108 formed onto the sides of the dummy gate 104. This expanding layer 108 is formed through an epitaxial process that is designed to grow on the dummy gate material 104 and not the material that makes up the protective layer 106. For example, the expanding layer 108 may be made of Silicon Germanium (SiGe) or Silicon Carbon (SiC). An epitaxy process involves the deposition of a crystalline overlayer onto a crystalline substrate. In this case, the expanding layer 108 acts as the crystalline overlayer and the dummy gate 104 acts as the crystalline substrate.

Figure 1C:
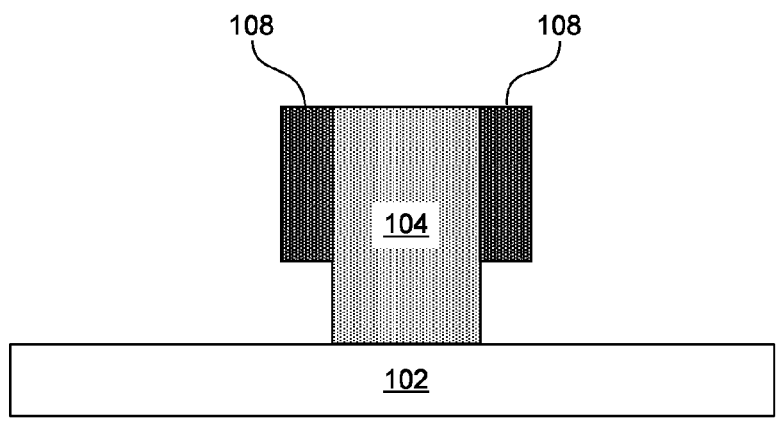

FIG. 1C illustrates the status of the process after the protective layer 106 has been removed. The protective layer 106 can be removed through an etching process that selectively removes the protective layer material and not the dummy gate or expanding layer material. After the protective layer 106 is removed, the dummy gate 104 is left with an expanding layer 104 surrounding the upper portion but not the lower portion. The benefits of such a structure will become more apparent through the discussion below.

Figure 1D:
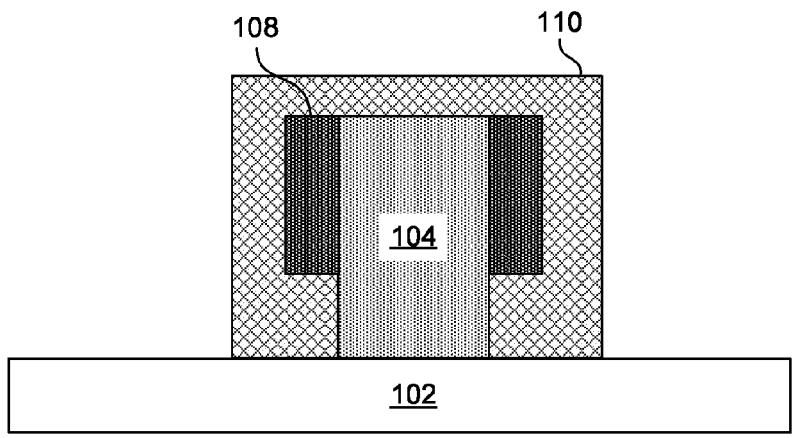

FIG. 1D illustrates the formation of a spacer 110 material formed around the dummy gate 104 and the expanding layer 108. Spacers 110 are commonly used in lithographic processes for a variety purposes. For example, a spacer can be used to protect the underlying substrate 102 near the gate from a doping process. Alternatively, spacers may be used for self-alignment purposes. The spacer materials used with gates embodying principles described herein may be standard spacer materials that are not etched away from certain subsequent etching processes.

Figure 1E:
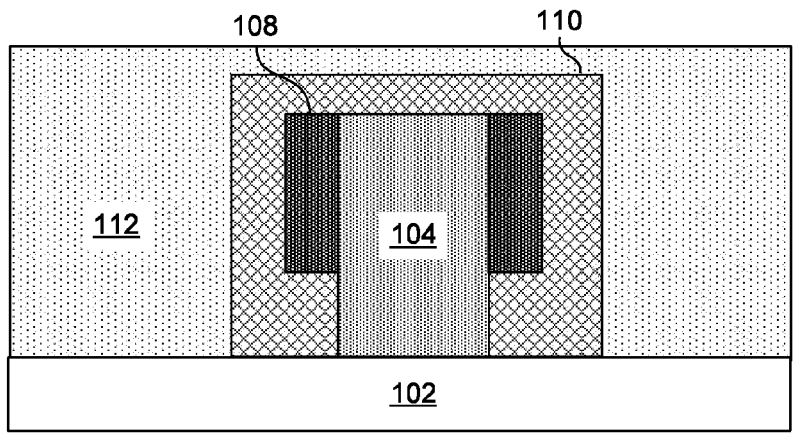

FIG. 1E illustrates the formation of a dielectric layer 112 to surround the spacer material 110. Such a dielectric layer 112 may be referred to as an Interlayer Dielectric (ILD). Such dielectric layers 112 are common in multilayer integrated circuits. The dielectric material 112 prevents the conduction of electrical current through unwanted paths. Thus, the gate of the transistor is isolated from other components within the circuit. Only conductive paths formed in connection to the gate allow electrical current to flow to or from the gate.

Figure 1F:
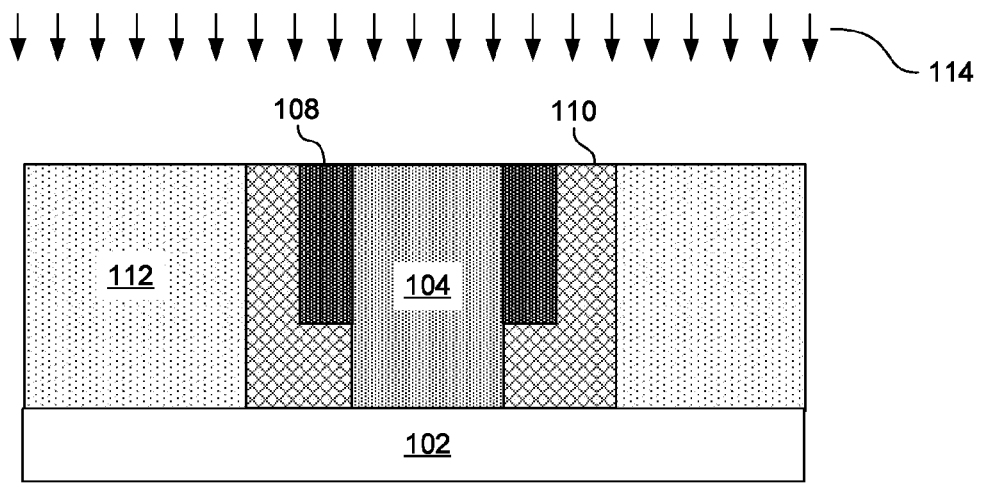

FIG. 1F illustrates a planarizing process 114. The planarizing process smoothes out the top of the dielectric layer 112 and exposes the top of the dummy gate 104 and the expanding layer 108. Thus, the dummy gate 104 and the expanding layer 108 can be exposed to various etching processes. The planarizing process may be a standard planarizing process such as a Chemical-Mechanical Polishing (CMP) process.

Figure 1G:
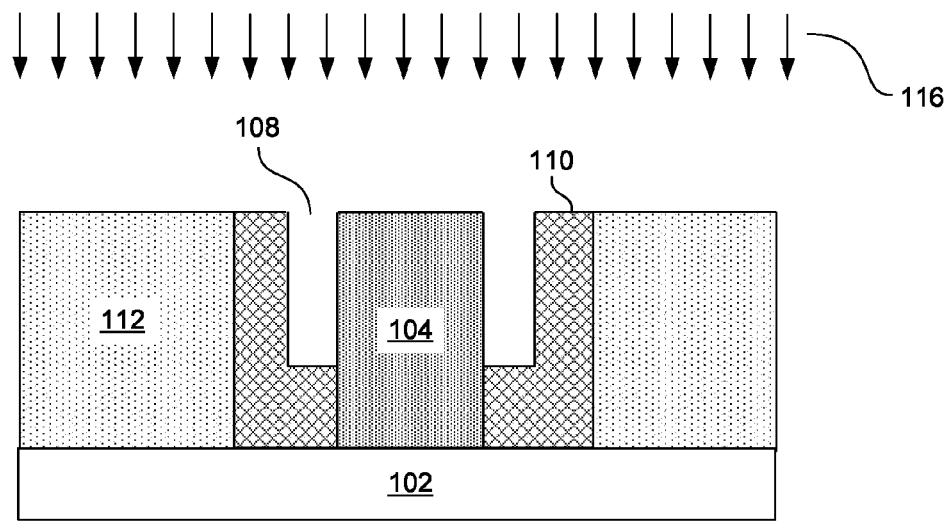

FIG. 1G illustrates an etching process 116 that selectively removes the expanding layer 108. That is, only the expanding layer 108 that was formed through an epitaxial process is removed while the dummy gate 104 remains. This leaves an open space between the spacer 110 and the dummy gate at the upper portion of the dummy gate 104. The etching process 116 may be a wet etching process. By removing the expanding layer first, the dummy gate 104 is more exposed to a subsequent etching process.

Figure 1H:
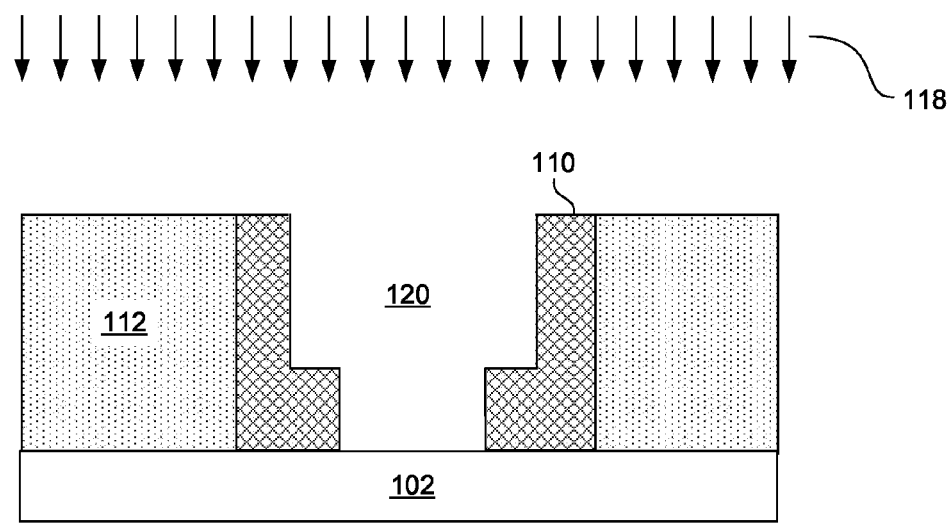

FIG. 1H illustrates a subsequent etching process 118 that removes the dummy gate 104. Because the space left from the expanding layer 108 exposes more of the dummy gate 104, the dummy gate 104 is more easily removed. The clean removal of the dummy gate 104 allows for a higher quality metal gate to be formed in the space left by the dummy gate 104. This etching process 118 may also be a wet etching process, and as such may do less damage to the dielectric layer 112. Some dry etching techniques may cause damage to the dielectric layer 112.

Figure 2:
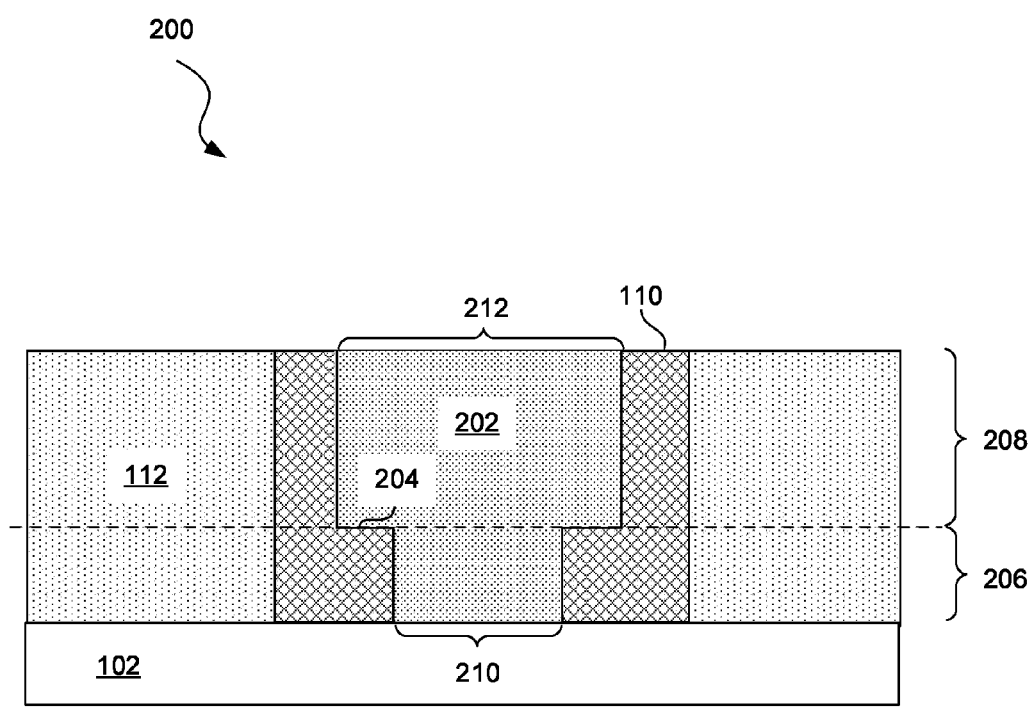
FIG. 2 is a diagram showing an illustrative completed dual damascene metal gate, according to one example of principles described herein.

FIG. 2 is a diagram showing an illustrative completed dual damascene metal gate 200. According to the present example, the space left by the dummy gate 104 is filled in with a metal material to form the metal gate 200. In some cases, other layers are formed onto the substrate at the bottom of the space left by the metal gate such as a high-k dielectric layer. For illustrative purposes, such layers are not shown.

The final structure includes a metal gate 202 having two widths. Specifically, the width 210 of the lower portion 206 of the metal gate 202 has a smaller width 212 than the upper portion 208 of the metal gate 202. The larger width 212 of the upper portion 208 is a result of the expanding layer that created a larger space on the upper portion 208 of the hole left by the dummy gate 104. The difference in diameter leaves a small shelf 204 at the area between the upper portion 208 and the lower portion 206.

A metal damascene gate is one that is formed through a damascene process. Because it is more difficult to pattern a metal layer, the metal features such as conductive lines or gates are typically formed in trenches. This is referred to as a damascene process. In this case, the metal gate is formed in a hole or trench left by the dummy gate as described above. A dual damascene process is when the metal fills in a pattern within a pattern, or a smaller trench within a trench. In the present example, the metal gate is referred to as a dual damascene metal gate 202 because the metal fills in the smaller width 210 lower portion 206 as well as the larger width 212 upper portion 208 of the hole left by the dummy gate.

The dual damascene metal gate may be used to form gates for a variety of transistors. For example, the dual damascene metal gate 202 may be part a standard MOSFET transistor device. In some examples, the dual damascene metal gate may be part of Fin Field Effect Transistor (FinFET). A FinFET is a type of transistor with a "fin" shaped gate. Other types of transistor gates may be performed using the dual damascene process described above.

A dual damascene metal gate embodying principles described herein does not use an additional mask for the different portions of the metal gate. Specifically, because the expanding layer can selectively grow on the sides of the dummy gate, an extra mask does not have to be used to pattern the upper portion differently. Thus, such dual damascene metal gates can be fabricated in a more cost effective manner. Moreover, the process described above can be used to fabricate multiple similar metal gates within an integrated circuit.

Figure 3:
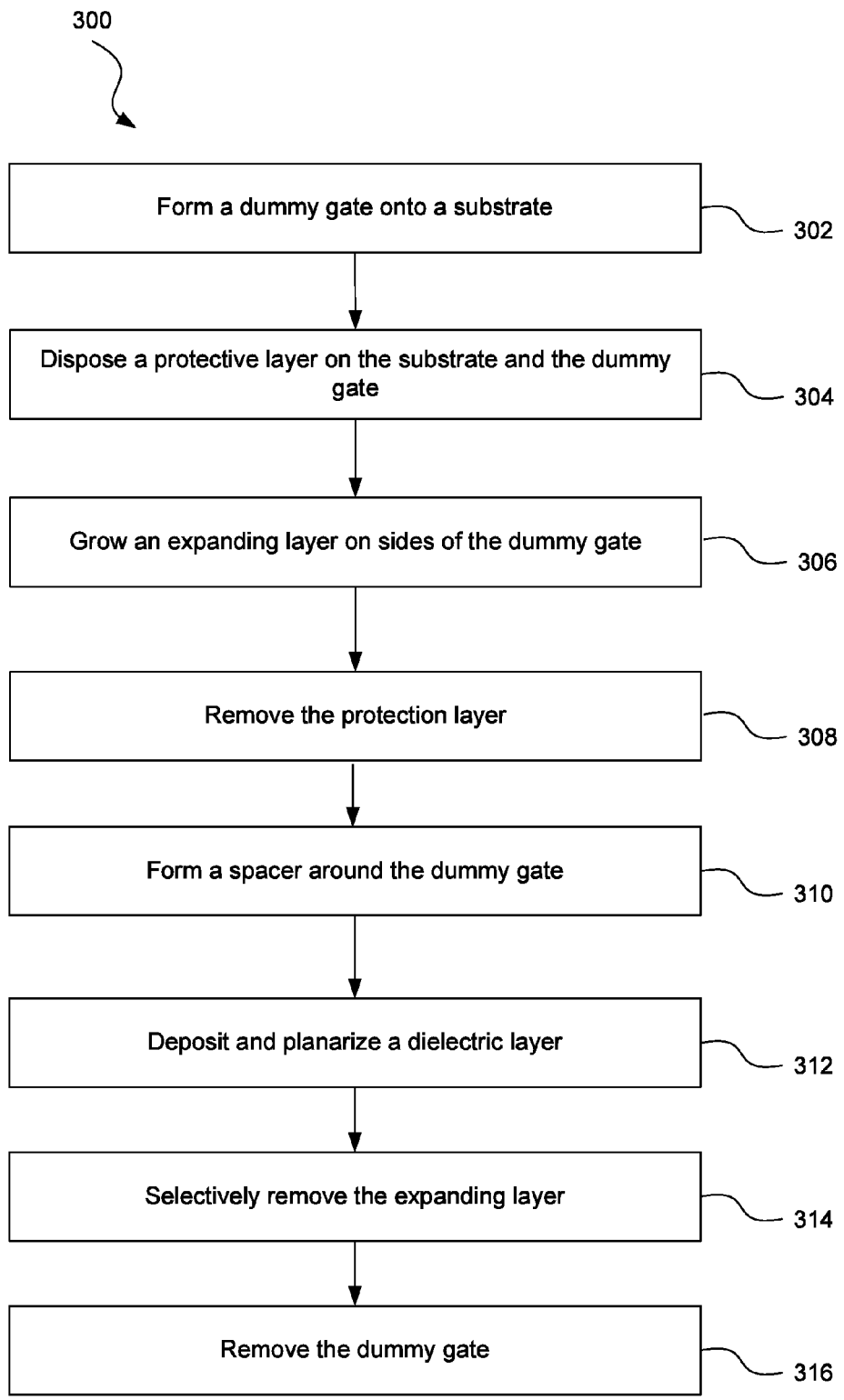
FIG. 3 is a flowchart showing an illustrative method for forming a dual damascene metal gate, according to one example of principles described herein.

FIG. 3 is a flowchart showing an illustrative method for forming a dual damascene metal gate. According to the present example, the method includes a step of forming 302 a dummy gate onto a substrate. The method also includes a step of disposing 304 a protective layer on the substrate and the dummy gate. The method also includes a step of growing 306 an expanding layer on sides of the dummy gate. The method also includes a step of removing 308 the protective layer. The method also includes a step of forming 310 a spacer around the dummy gate. The method also includes a step of depositing 312 and planarizing a dielectric layer. The method also includes a step of selectively removing 314 the expanding layer. The method also includes a step of removing 316 the dummy gate.

According to certain illustrative examples, a method for fabricating a dual damascene metal gate includes forming a dummy gate onto a substrate, disposing a protective layer on the substrate and the dummy gate, growing an expanding layer on sides of the dummy gate, removing the protective layer, forming a spacer around the dummy gate, depositing and planarizing a dielectric layer, selectively removing the expanding layer, and removing the dummy gate.

According to certain illustrative examples, a method for fabricating a dual damascene metal gate includes disposing a protective layer on a substrate and a dummy gate, the protective layer not being formed on sides of the dummy gate. The method further includes growing, through an epitaxial process, an expanding layer on sides of the dummy gate. The method further includes forming a spacer around the dummy gate after removing the protective layer, filling in area around the dummy gate with a dielectric material. The method further includes planarizing the dielectric layer, spacer, and the dummy gate. The method further includes removing the expanding layer before removing the dummy gate.

According to certain illustrative examples, a dual damascene metal gate includes a lower portion of a metal gate surrounded by a dielectric layer, the lower portion of the metal gate having a first width, an upper portion of the metal gate having a second dimension that is larger than the first dimension such that there is a shelf between the lower portion and the upper portion. The space for the lower portion of the metal gate was formed by a dummy gate and the space for the upper portion of the metal gate was formed by both a dummy gate and an epitaxially grown expanding layer on the sides of the dummy gate.

It is understood that various different combinations of the above-listed embodiments and steps can be used in various sequences or in parallel, and there is no particular step that is critical or required. Additionally, although the term "electrode" is used herein, it will be recognized that the term includes the concept of an "electrode contact." Furthermore, features illustrated and discussed above with respect to some embodiments can be combined with features illustrated and discussed above with respect to other embodiments. Accordingly, all such modifications are intended to be included within the scope of this invention.

The foregoing has outlined features of several embodiments. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions and alterations herein without departing from the spirit and scope of the present disclosure.

What is claimed is:

1. A method for fabricating a metal gate, the method comprising:
    forming a dummy gate onto a substrate;
    disposing a protective layer on the substrate and on a top surface and a first portion of a sidewall surface of the dummy gate, wherein a second portion of the sidewall surface is free of the protective layer;
    growing an expanding layer on sides of the dummy gate;
    removing the protective layer;
    forming a spacer around the dummy gate and the expanding layer;
    depositing and planarizing a dielectric layer around the spacer;
    removing the expanding layer; and
    removing the dummy gate.

2. The method of claim 1, wherein the protective layer includes an anti-reflective coating material.

3. The method of claim 1, wherein the expanding layer comprises a material that can be selectively grown through an epitaxial process onto a material that forms the dummy gate.

4. The method of claim 3, wherein the dummy gate comprises a semiconductor material and the expanding layer comprises silicon germanium.

5. The method of claim 1, wherein the expanding layer is selectively removed from the dummy gate, before the dummy gate is removed.

6. The method of claim 1, wherein the dummy gate is removed through a wet etch process.

7. The method of claim 1, wherein the protective layer is thick enough to leave a shelf within a hole left after removal of the dummy gate.

8. The method of claim 1, further comprising, filling in a hole left after removal of the dummy gate with a metal gate.

9. A method for fabricating a metal gate, the method comprising:
    disposing a protective layer on a substrate and a dummy gate, the protective layer not being formed on sides of the dummy gate, wherein the dummy gate includes a conductive material;
    growing, through an epitaxial process, an expanding layer on sides of the dummy gate such that the expanding layer physically contacts the conductive material of the dummy gate;
    forming a spacer around the dummy gate after removing the protective layer;
    filling in area around the dummy gate with a dielectric material;
    planarizing the dielectric layer, spacer, and the dummy gate;
    removing the expanding layer before removing the dummy gate.

10. The method of claim 9, wherein the protective layer includes an anti-reflective coating material.

11. The method of claim 9, wherein the expanding layer comprises a material that can be selectively grown through an epitaxial process onto a material that forms the dummy gate and does not grow on the protective layer.

12. The method of claim 9, wherein the dummy gate comprises a semiconductor material and the expanding layer comprises silicon germanium.

13. The method of claim 9, wherein the expanding layer can be selectively removed from the dummy gate.

14. The method of claim 9, wherein the dummy gate is removed through a wet etch process.

15. The method of claim 9, wherein the protective layer is thick enough to leave a shelf within a hole left after removal of the dummy gate.

16. The method of claim 9, further comprising, filling in a hole left after removal of the dummy gate with a metal material to form a metal gate.

17. A method comprising:
    forming a protective layer over a gate structure on a substrate, wherein forming the protective layer includes forming the protective layer on a top surface and a first portion of a sidewall surface of the gate structure such that a second portion of the sidewall surface is free of the protective layer;
    forming a conductive layer on the second portion of the sidewall surface such that the conductive layer physically contacts the second portion of the sidewall surface;
    removing the protective layer to expose the first portion of the sidewall surface of the gate structure;
    forming a spacer on the first portion of the sidewall surface of the gate structure such that the spacer physically contacts the first portion of the sidewall surface;
    removing the conductive layer; and
    removing the gate structure.

18. The method of claim 17, wherein removing the conductive layer includes completely removing the conductive layer to form a trench adjacent the gate structure.

19. The method of claim 17, wherein forming the conductive layer on the second portion of the sidewall surface includes forming the conductive layer on a top surface of the protective layer that faces away from the substrate.

20. The method of claim 17, wherein the conductive layer includes a material selected from the group consisting of SiC and SiGe.

* * * * *